US008223056B2

(12) United States Patent
Dura et al.

(10) Patent No.: US 8,223,056 B2
(45) Date of Patent: Jul. 17, 2012

(54) CYCLIC DIGITAL TO ANALOG CONVERTER (75) Inventors: Renaud Dura, Aix en Provence (FR); Joao P. Carreira, Pourriere (FR); Sebastien Fievet, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/436,620

(22) Filed: May 6, 2009

(65) Prior Publication Data

US 2010/0283651 A1    Nov. 11, 2010

(51) Int. Cl.
H03M 1/66 (2006.01)

(52) U.S. Cl. ........ 341/150; 341/143; 341/144; 341/161; 341/172

(58) Field of Classification Search .......... 341/144–154, 341/143, 161, 172
See application file for complete search history.

(56) References Cited

U.S. PATENT DOCUMENTS

| | | | |
|---|---|---|---|
| 4,622,536 A | | 11/1986 | Shih et al. |
| 4,988,900 A | * | 1/1991 | Fensch ................. 327/337 |
| 5,821,891 A | * | 10/1998 | Shi et al. .................. 341/143 |
| 5,892,473 A | * | 4/1999 | Shin ....................... 341/150 |
| 5,923,275 A | * | 7/1999 | Kalb ....................... 341/150 |
| 5,990,819 A | | 11/1999 | Fujimori |
| 6,952,176 B2 | * | 10/2005 | Frith et al. ............... 341/143 |
| 7,034,737 B1 | * | 4/2006 | Huang ..................... 341/172 |
| 7,061,418 B2 | * | 6/2006 | Zebedee ................. 341/150 |
| 7,102,557 B1 | * | 9/2006 | Frith ....................... 341/150 |
| 7,199,743 B2 | | 4/2007 | Casper et al. |
| 7,265,705 B1 | * | 9/2007 | Lee et al. ................ 341/162 |
| 7,436,341 B2 | * | 10/2008 | Hsiao ...................... 341/150 |
| 7,443,329 B2 | * | 10/2008 | Sutardja ................. 341/150 |
| 7,551,113 B2 | * | 6/2009 | Wu et al. ................. 341/150 |
| 7,629,917 B2 | * | 12/2009 | Shinohara .............. 341/172 |
| 2009/0231176 A1 | * | 9/2009 | Chen et al. .............. 341/150 |
| 2010/0283651 A1 | * | 11/2010 | Dura et al. .............. 341/150 |

OTHER PUBLICATIONS

Debrunner, L. S, et al., "Defining canonical-signed-digit number systems as arithmetic codes", *Conference Record of the Thirty-Sixth Asilomar Conference on Signals, Systems and Computers*, vol. 2, (2002), 1593-1597.

Matsumoto, H., et al., "Switched-capacitor algorithmic digital-to-analog converters", *IEEE Transactions on Circuits and Systems*, 33(7), (Jul. 1986), 721-724.

* cited by examiner

*Primary Examiner* — Linh Nguyen (74) *Attorney, Agent, or Firm* — Fish & Richardson P.C.

(57) ABSTRACT

Some embodiments include apparatus and methods having an amplifier, a capacitor network coupled to the amplifier, and switching circuitry coupled to the amplifier and the capacitor network. The switching circuit is configured to successively apply a selected reference voltage selected from among a first reference voltage, a second reference voltage, and a third reference voltage to the capacitor network in response to a digital input code to generate an output voltage. Additional embodiments are disclosed.

23 Claims, 9 Drawing Sheets

CYCLIC DIGITAL TO ANALOG CONVERTER

BACKGROUND

Many circuit devices, such as processors and microcontrollers used in electronic products, have digital to analog converter (DAC) circuits to convert information in digital form into corresponding information in analog form. Digital information is normally presented by signals having two discrete values, a binary one (logic one) and a binary zero (logic zero). Analog information is often represented by signals having many values within a specific range.

DETAILED DESCRIPTION

Figure 1:
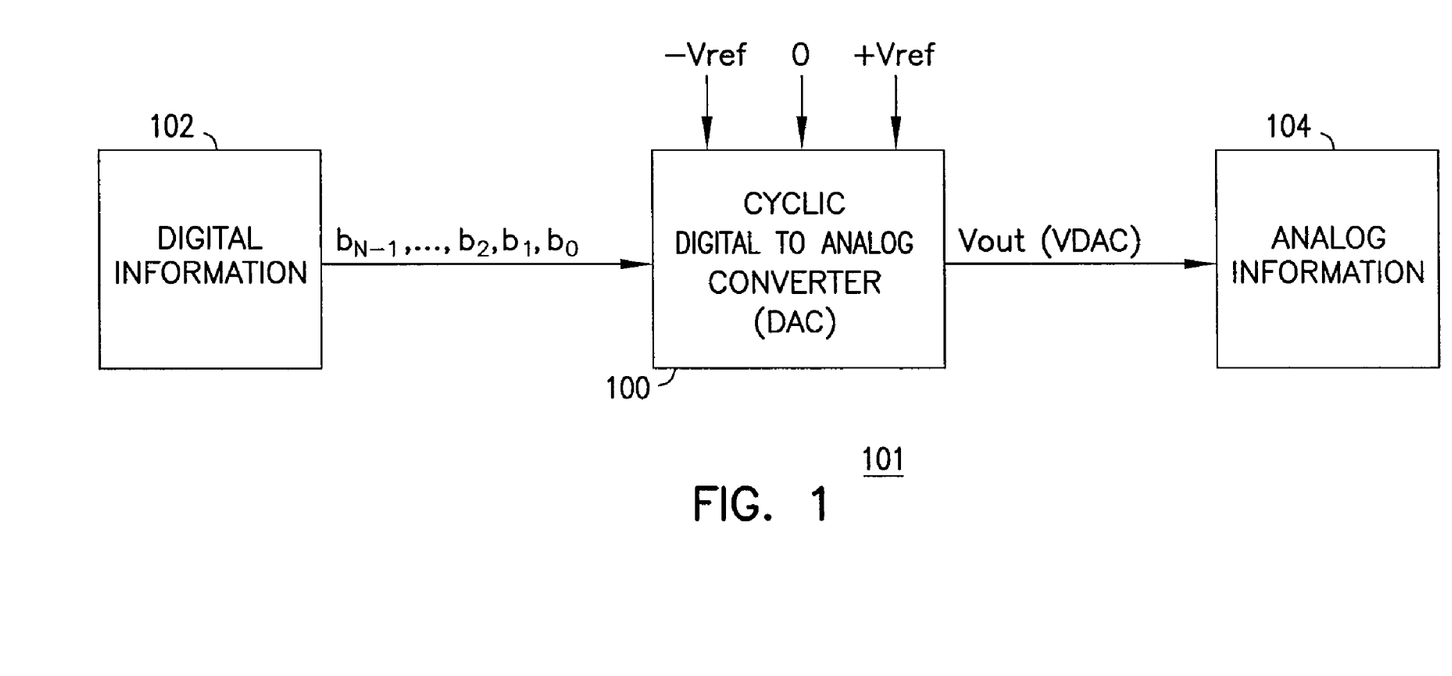
FIG. 1 shows a partial block diagram of an apparatus including a cyclic DAC, according to an embodiment of the invention.

FIG. 1 shows a partial block diagram of apparatus 101 including a cyclic DAC 100, according to an embodiment of the invention. Apparatus 101 can include or be included in audio, video, telecommunication, networking, imaging, sensor, or other systems. As shown in FIG. 1, DAC 100 receives a N bits digital input code $b_0$ through $b_{N-1}$ ($b_{N-1}, \ldots, b_2, b_1, b_0$) from a digital information unit 102 and generates an analog output voltage Vout (or VDAC). An analog information unit 104 receives voltage Vout from DAC 100 for further processing.

DAC 100 operates as a cyclic digital to analog converter. In operation, DAC 100 initially sets (or resets) output voltage Vout to an initial value, e.g., zero. Then, DAC 100 successively applies a reference output voltage to output voltage Vout to obtain a final value of Vout that represents an analog voltage value corresponding to the data input code. DAC 100 selects from among three reference voltage $-$Vref, 0, and $+$Vref (e.g., Vref) and applies the selected reference voltage to output voltage Vout. Each selection of the reference voltage to be applied is based on the value of one of the bits of the digit input code. The value of one of the three reference values can be zero, as shown in FIG. 1. The following description shows details of the operation of DAC 100.

Initially, DAC 100 sets the output voltage to zero: $Vout_{-1}=0$.

DAC 100 successively updates each value of output voltage Vout based on a recursive equation (1) below, until a final value of Vout is obtained.

$$Vout_j = \frac{Vout_{j-1} + f_i \cdot Vref}{2} \quad \text{(equation 1)}$$

In equation (1), $i=j=0$ to $N-1$, where N is the number of bits of digital input code. For example, if digital input code is $b_2$, $b_1$, and $b_0$, then $N=3$. Integer $f_i$ is a function of $b_i$. In DAC 100, $f_i$ is defined in equation (2) and equation (3) below.

$$f_0 = 2b_{N-1} - 1 \quad \text{(equation 2)}$$

$$f_i = b_{N-1} - 1 + b_{i-1} \quad \text{(equation 3)}$$

DAC 100 can start the conversion with the least significant bit (LSB) applied first or with the most significant bit (MSB) applied first. In the LSB applied first technique, a first value of voltage Vout is generated based on the LSB of the digital input code. In the MSB applied first technique, a first value of voltage Vout is generated based on the MSB of the digital input code. In digital input code $b_{N-1}, \ldots, b_2, b_1, b_0$, the LSB is $b_0$, and the MSB is $b_{N-1}$. The following description shows an example of how DAC 100 converts a 3-bit ($N=3$) digital input code $b_2$, $b_1$, $b_0$ into an analog output voltage using equation (1), (2), and (3) above. This example uses the LSB applied first technique in which a first value of Vout is generated corresponding to the value of bit $b_0$. From equation (1), the value of output voltage Vout corresponding to each bit of the digital input code is generated as followed.

$$Vout_0 = \frac{(2b_{N-1} - 1) \cdot Vref}{2}$$

$$Vout_1 = \frac{(2b_{N-1} - 1) \cdot Vref}{2^2} + \frac{(b_{N-1} - 1 + b_0) \cdot Vref}{2}$$

$$Vout_2 = \frac{(2b_{N-1} - 1) \cdot Vref}{2^3} + \frac{(b_{N-1} - 1 + b_0) \cdot Vref}{2^2} + \frac{(b_{N-1} - 1 + b_1) \cdot Vref}{2^1}$$

The final value of output voltage Vout for N bits digital input code is $Vout_{N-1}$, which is obtained from the last conversion step $N-1$. Thus, the final value of the output voltage in the example above (where $N=3$) is $Vout_{N-1}=Vout_2$, as shown above. The above example shows an example conversion for a digital input code with $N=3$ bits. For other values of N, the output voltage of DAC 100 is generated based on equation (4) below.

$$Vout_{N-1} = \frac{(2b_{N-1} - 1) \cdot Vref}{2^N} + \sum_{i=1}^{N-1} \frac{(b_{N-i} - 1 + b_{i-1}) \cdot Vref}{2^{N-i}} \quad \text{(equation 4)}$$

The above equation (4) shows the output voltage of DAC 100 when an LSB applied first technique is used. For the MSB applied first technique, the final result of the output voltage $Vout_{N-1}$ would be the same as $Vout_{N-1}$ in the case of the LSB applied first technique.

From equation (3) above, $f_i$ can have three possible values: $-1$, 0, and $+1$.

$f_i = b_{N-1} - 1 + b_{i-1} = -1$ if $b_{N-1} = 0$ and $b_{i-1} = 0$ $f_i = b_{N-1} - 1 + b_{i-1} = 0$ if $b_{N-1} = 0$ and $b_{i-1} = 1$ (or if $b_{N-1} = 1$ and $b_{i-1} = 0$)

$f_i = b_{N-1} - 1 + b_{i-1} = +1$ if $b_{N-1} = 1$ and $b_{i-1} = 1$

Thus, from equation (1) above, the value of output voltage Vout, before a division by two, can decrease (e.g., by subtracting a reference voltage Vref), increase (e.g., by adding a reference voltage Vref), or remain unchanged (adding or subtracting zero). From equation (1) above, $Vout_j$ calculated at a particular step j can also have three possible values corresponding to three values of $f_i=-1$, 0, or +1.

$$Vout_j = \frac{Vout_{j-1} - Vref}{2} \text{ if } f_i = -1 \quad \text{(equation 5)}$$

$$Vout_j = \frac{Vout_{j-1} + 0}{2} \text{ if } f_i = 0 \quad \text{(equation 6)}$$

$$Vout_j = \frac{Vout_{j-1} + Vref}{2} \text{ if } f_i = +1 \quad \text{(equation 7)}$$

In the above equations (5), (6), and (7), $Vout_{j-1}$ represents the output voltage value calculated by DAC 100 at step j−1, which is a step immediately before step j, also called a previous step. Thus, as shown in equation (5), (6), and (7), the value of $Vout_j$ can be the previous output voltage value $Vout_{j-1}$ minus a reference voltage Vref and then divided by two (equation 5), $Vout_{j-1}$ plus a reference voltage Vref and then divided by two (equation 7), or $Vout_{j-1}$ plus zero and then divided by two (equation 6).

Equation (6) is equivalent to $Vout_j=Vout_{j-1}/2$, meaning that during calculation of $Vout_j$, no reference voltage is added to or subtracted from a previous output voltage $Vout_{j-1}$ before the previous output voltage is divided by two. Thus, in DAC 100, since no addition or subtraction is performed to the output voltage in some step (e.g., when $f_i=0$) during the successive calculation to obtain the final value $Vout_{N-1}$ of the output voltage, DAC 100 can avoid undesirable affects related to a reference voltage being added to or subtracted from the output voltage.

The above description relates to a general recursive step to obtain $Vout_j$ during a particular step. The following description shows an example conversion of all possible values of a combination of three bits $b_2$, $b_1$, and $b_0$ (N=3) to an output voltage Vout in DAC 100, where $b_0$ is the LSB and $b_2$ is the MSB. In Table 1, FIG. 2 and FIG. 3, the reference voltage Vref is normalized, meaning that +Vref is +1 and −Vref is −1. Thus, the range of the output voltage is between −1 and +1 or −Vref<Vout<+Vref. The analog resolution (or LSB) for DAC 100 in this example is $(+Vref-(-Vref))/2^N = 2/8 = 1/4$.

Table 1 shows an example of a mapping of digital input codes to output voltage Vout for N=3. The values of $f_0$, $f_1$, and $f_2$ are calculated based on equation (2) and (3) above.

TABLE 1

| $b_2, b_1, b_0$ | | $f_2, f_1, f_0$ | Output Voltage (Vout) |
|---|---|---|---|
| decimal | binary | equation (2) and (3) | normalized |
| 0 | 000 | −1 −1 −1 | −7/8 |
| 1 | 001 | −1 0 −1 | −5/8 |
| 2 | 010 | 0 −1 −1 | −3/8 |
| 3 | 011 | 0 0 −1 | −1/8 |
| 4 | 100 | 0 0 +1 | +1/8 |
| 5 | 101 | 0 +1 +1 | +3/8 |
| 6 | 110 | +1 0 +1 | +5/8 |
| 7 | 111 | +1 +1 +1 | +7/8 |

Table 2 below shows step-by-step details of Vout generated by DAC 100 for all eight possible combinations of digital input code $b_2$, $b_1$, $b_0$ based on the mapping of Table 1.

TABLE 2

| i | bi | binary | decimal | $f_i$ "−1/0/+1" | desired analog | j | $Vout_j$ | $Vout_j =$ $(Vout_{j-1} + f_i \cdot Vref)/2$ [step] |
|---|---|---|---|---|---|---|---|---|
| reset | | | | | | −1 | 0.000 | 0.000 |
| 0 | b0 | 0 | 0 | −1 | −0.125 | 0 | −0.500 | 0.500 |
| 1 | b1 | 0 | 0 | −1 | −0.250 | 1 | −0.750 | 0.250 |
| 2 | b2 | 0 | 0 | −1 | −0.500 | 2 | −0.875 | 0.125 |
| b<2:0> | Digital value | | 0 | | | | | max step |
| | Analog value (V) | | | | −0.875 | | −0.875 | 0.500 |
| reset | | | | | | −1 | 0.000 | 0.000 |
| 0 | b0 | 1 | 1 | −1 | −0.125 | 0 | −0.500 | 0.500 |
| 1 | b1 | 0 | 0 | 0 | 0.000 | 1 | −0.250 | 0.250 |
| 2 | b2 | 0 | 0 | −1 | −0.500 | 2 | −0.625 | 0.375 |
| b<2:0> | Digital value | | 1 | | | | | max step |
| | Analog value (V) | | | | −0.625 | | −0.625 | 0.500 |
| reset | | | | | | −1 | 0.000 | 0.000 |
| 0 | b0 | 0 | 0 | −1 | −0.125 | 0 | −0.500 | 0.500 |
| 1 | b1 | 1 | 2 | −1 | −0.250 | 1 | −0.750 | 0.250 |
| 2 | b2 | 0 | 0 | 0 | 0.000 | 2 | −0.375 | 0.375 |
| b<2:0> | Digital value | | 2 | | | | | max step |
| | Analog value (V) | | | | −0.375 | | −0.375 | 0.500 |
| reset | | | | | | −1 | 0.000 | 0.000 |
| 0 | b0 | 1 | 1 | −1 | −0.125 | 0 | −0.500 | 0.500 |
| 1 | b1 | 1 | 2 | 0 | 0.000 | 1 | −0.250 | 0.250 |
| 2 | b2 | 0 | 0 | 0 | 0.000 | 2 | −0.125 | 0.125 |
| b<2:0> | Digital value | | 3 | | | | | max step |
| | Analog value (V) | | | | −0.125 | | −0.125 | 0.500 |
| reset | | | | | | −1 | 0.000 | 0.000 |
| 0 | b0 | 0 | 0 | 1 | 0.125 | 0 | 0.500 | 0.500 |
| 1 | b1 | 0 | 0 | 0 | 0.000 | 1 | 0.250 | 0.250 |
| 2 | b2 | 1 | 4 | 0 | 0.000 | 2 | 0.125 | 0.125 |
| b<2:0> | Digital value | | 4 | | | | | max step |
| | Analog value (V) | | | | 0.125 | | 0.125 | 0.500 |
| reset | | | | | | −1 | 0.000 | 0.000 |
| 0 | b0 | 1 | 1 | 1 | 0.125 | 0 | 0.500 | 0.500 |
| 1 | b1 | 0 | 0 | 1 | 0.250 | 1 | 0.750 | 0.250 |
| 2 | b2 | 1 | 4 | 0 | 0.000 | 2 | 0.375 | 0.375 |

TABLE 2-continued

| i | bi | binary | decimal | $f_i$ "−1/0/+1" | desired analog | j | $Vout_j$ | $Vout_j =$ $(Vout_{j-1} + f_i \cdot Vref)/2$ [step] |
|---|---|---|---|---|---|---|---|---|
| b<2:0> | Digital value | | 5 | | | | | max step |
| | Analog value (V) | | | | 0.375 | | 0.375 | 0.500 |
| reset | | | | | | −1 | 0.000 | 0.000 |
| 0 | b0 | 0 | 0 | 1 | 0.125 | 0 | 0.500 | 0.500 |
| 1 | b1 | 1 | 2 | 0 | 0.000 | 1 | 0.250 | 0.250 |
| 2 | b2 | 1 | 4 | 1 | 0.500 | 2 | 0.625 | 0.375 |
| b<2:0> | Digital value | | 6 | | | | | max step |
| | Analog value (V) | | | | 0.625 | | 0.625 | 0.500 |
| reset | | | | | | −1 | 0.000 | 0.000 |
| 0 | b0 | 1 | 1 | 1 | 0.125 | 0 | 0.500 | 0.500 |
| 1 | b1 | 1 | 2 | 1 | 0.250 | 1 | 0.750 | 0.250 |
| 2 | b2 | 1 | 4 | 1 | 0.500 | 2 | 0.875 | 0.125 |
| b<2:0> | Digital value | | 7 | | | | | max step |
| | Analog value (V) | | | | 0.875 | | 0.875 | 0.500 |

As shown in Table 2, a conversion of each combination of $b_2$, $b_1$, $b_0$ includes four steps j, shown in column j as four steps labeled −1, 0, 1, and 2. Step −1 is performed to reset DAC 100 to set the value of output voltage to zero, shown as $Vout_j=0.000$ in step −1. Table 2 also shows other values of Vout at other steps (0, 1, 2) j for each combination of $b_2$, $b_1$, $b_0$. For example, for $b_2$, $b_1$, $b_0=1\ 0\ 1$, the values of Vout are 0.500, 0.750, and 0.375, with 0.375 being the final value of Vout. In another example, for $b_2$, $b_1$, $b_0=0\ 1\ 1$, the values of Vout are 0.500, −0.250, and −0.125, with −0.125 being the final value of Vout.

Table 2 also shows changes in values of Vout between steps (shown in the column "step"). For example, for $b_2$, $b_1$, $b_0=1\ 0\ 1$, the value changes are 0000, 0.500, 0.250, and 0.375. Each of these values changes is the difference between two consecutive values of Vout. For example, the previous value of Vout (at step 0) is 0.500 and a current value of Vout (at step 1) is 0.750. Therefore, the difference between 0.500 and 0.750 is 0.250, which is shown in Table 2 as 0.250. Thus, the value change of Vout indicates the magnitude that Vout changes from one step to the next step.

Table 2 shows an example for N=3 bits to help focus on the embodiments described herein. The algorithm described herein can also be applied to a DAC of more than three bits.

Figure 2:
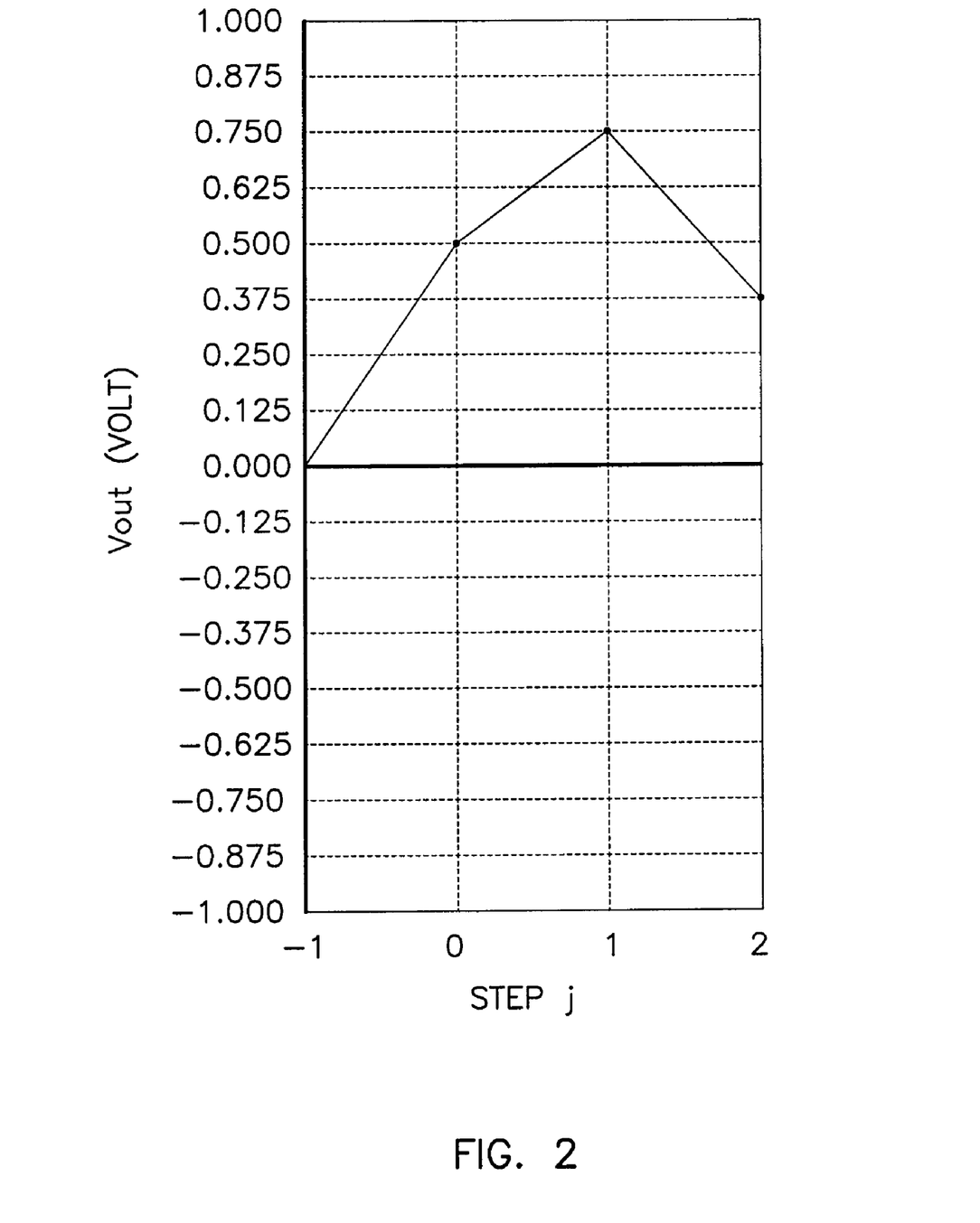
FIG. 2 and FIG. 3 show graphical forms of output voltages, according to an embodiment of the invention.
Figure 3:
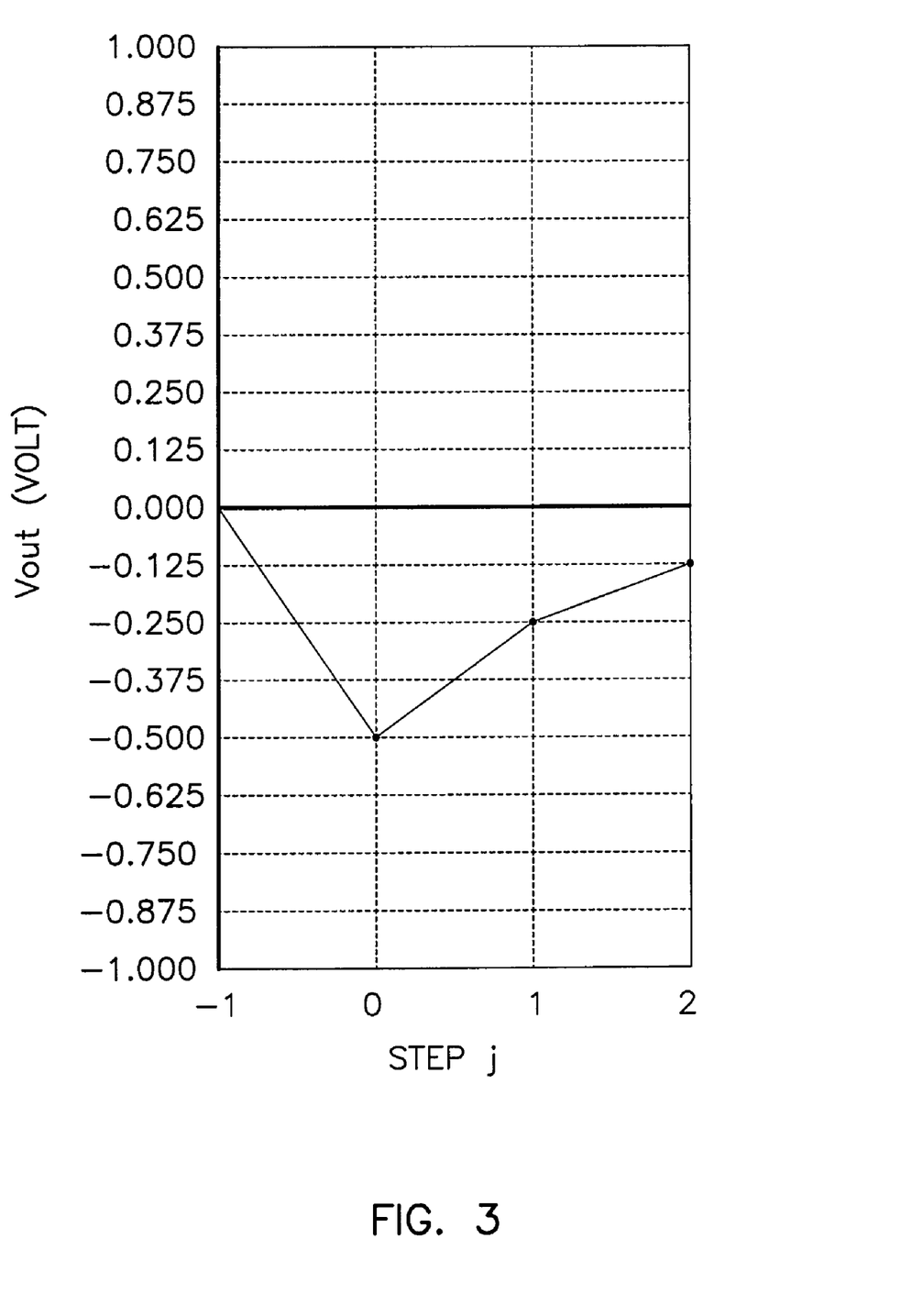

FIG. 2 and FIG. 3 show graphical forms of output voltage Vout of Table 2 at various steps j during conversions of digital input code $b_2$, $b_1$, $b_0=1\ 0\ 1$ and $b_2$, $b_1$, $b_0=0\ 1\ 1$, respectively. The values of Vout in FIG. 2 and FIG. 3 are based on the same values of Vout for the corresponding $b_2$, $b_1$, $b_0=1\ 0\ 1$ and $b_2$, $b_1$, $b_0=0\ 1\ 1$ from Table 2.

As shown in FIG. 2, Vout initially is zero (e.g., reset to 0) before conversion ($Vout_{-1}=0$). In step 0, the value of $Vout_{-1}$ changes (is updated) from zero to $Vout_0=0.500$ based on the calculation of Vout using equation (1). In step 1, the value of $Vout_0=0.500$ changes (is updated) to $Vout_1=0.750$ based on the calculation of Vout using equation (1). In step 2 (final step for N=3), the value of $Vout_1=0.750$ changes (is updated) to $Vout_2=0.375$ based on the calculation of Vout using equation (1).

The graphical form of output voltage Vout of FIG. 3 corresponding to $b_2$, $b_1$, $b_0=0\ 1\ 1$ is created in ways similar to that of Vout of FIG. 2.

As shown in Table 2 and in FIG. 2 and FIG. 3, for any combination of $b_2$, $b_1$, $b_0$, the maximum value that Vout changes from one step to the next step is 0.500, which is at most equal to one half of the value of Vref=1.

In comparison to some conventional digital to analog converters (DACs), DAC 100 of FIG. 1 generally can have a smaller length of the path for output voltage Vout. The length is the sum of the segments from Vout=0 (at step j=−1) to the final value $Vout_{N-1}$. Since the length of the path of Vout is generally smaller than that of some conventional DACs, the DAC 100 can be more efficient relative to some conventional DACs. Further, the maximum value change of Vout from one step to another step can generally be smaller than that of some conventional DACs, especially for the middle values of the digital input code. Thus, the time for DAC 100 to reach a final value ($Vout_{N-1}$) of the output voltage can be smaller than that of conventional DACs, for the same accuracy. Therefore, DAC 100 can also be faster than conventional DACs.

Figure 4:
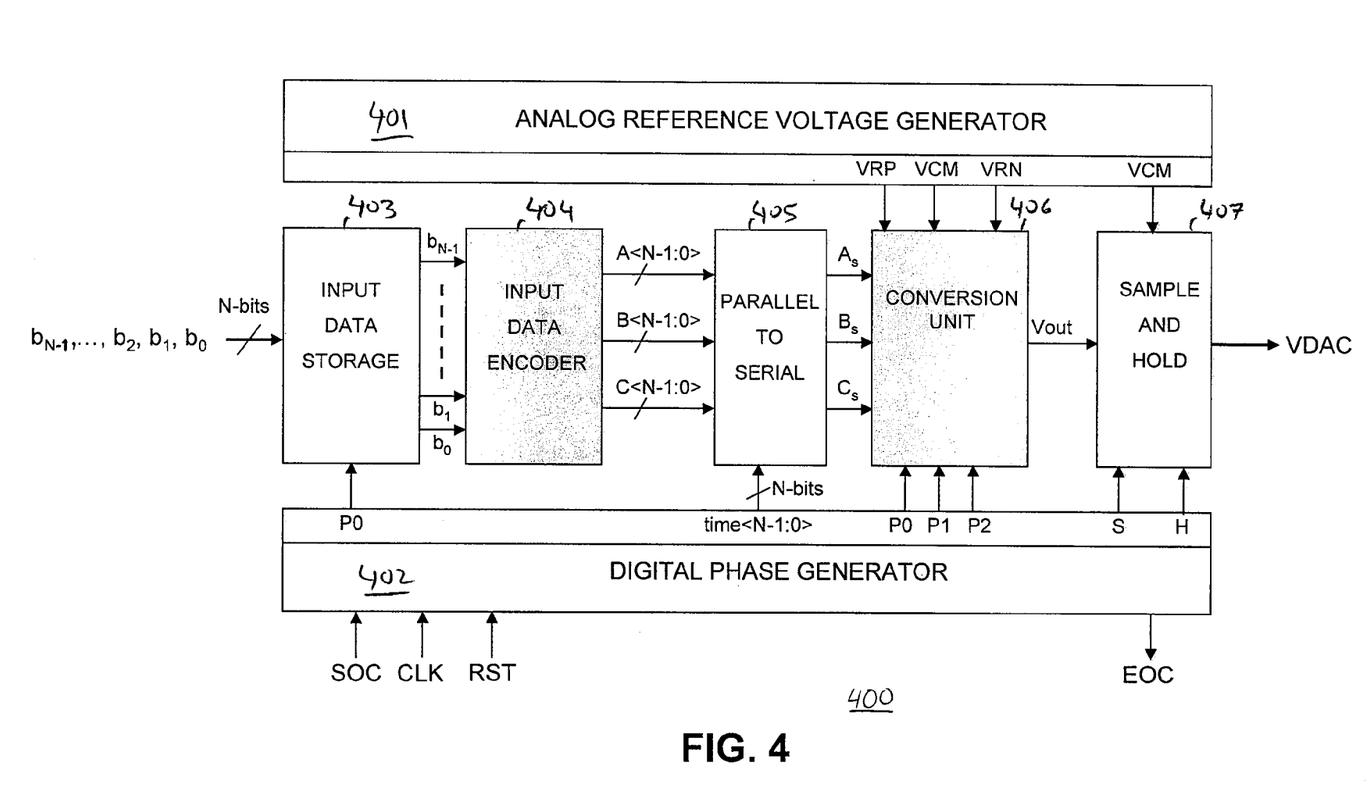
FIG. 4 shows a partial block diagram of a DAC, according to an embodiment of the invention.

FIG. 4 shows a partial block diagram of a DAC 400, according to an embodiment of the invention. DAC 400 includes an analog reference voltage generator 401, a digital phase generator 402, a input data storage 403, an input data encoder 404, an N-bit parallel to serial converter 405, a conversion unit 406, and a sample and hold output unit 407.

Analog reference voltage generator 401 generate reference voltages (signals) VRP, VRN, and VCM that are used during a conversion of a digital input code $b_0$, $b_1$, and $b_2$ through $b_{N-1}$ received at data input storage 403. Reference voltages VRP, VRN, and VCM are corresponding respectively to reference voltages +Vref, −Vref, and 0 described above.

Digital phase generator 402 receives a clock signal CLK, a signal SOC (start of conversion) to start a conversion of a digital input code, and a reset signal RST to reset DAC 400 before conversion of a first bit of a digital input code. DAC 400 provides a signal EOC (end of cycle) upon completion of a conversion of a digital input code. DAC 400 launches a conversion cycle when the SOC signal is detected high (e.g., SOC=1). Digital phase generator 402 also generates signals P0, P1, P2, and time<N−1:0> (i.e., time<0> through time<N−1>) in a regular sequence, and uses these signals during a conversion of a digital input code, as described in more details below with reference to FIG. 5 through FIG. 9.

Input data encoder 404 in FIG. 4 receives the N-bit digital input code $b_0$, $b_1$, and $b_2$ through $b_{N-1}$ in parallel and generates a first parallel N bits A<N−1:0> (i.e., A0 through $A_{N-1}$) on a first set of N lines; a second parallel N bits B<N−1:0> (i.e., B0 through $B_{N-1}$) on a second set of N lines; and a third parallel N bits C<N−1:0> (i.e., C0 through $C_{N-1}$) on a third set of N lines.

Parallel to serial converter 405 converts the parallel N bits A<N−1:0> into one serial bit $A_S$, the parallel N bits B<N−1:0> into one serial bit $B_S$, and the parallel N bits C<N−1:0> into one serial bit $C_S$. As shown in FIG. 4, each of the serial bits $A_S$, $B_S$, $C_S$, is transferred on a single line from parallel to serial converter 405 to conversion unit 406.

Conversion unit 406 receives the 3 serial bits $A_S$, $B_S$, and $C_S$ based on timing of time time<N−1:0> as follows.

For LSB first implementation:

$$A_S = A0 \cdot \text{time}<0> + A1 \cdot \text{time}<1> + \ldots + A_i \cdot \text{time}<i> + \ldots + A_{N-1} \cdot \text{time}<N-1>$$

$$B_S = B0 \cdot \text{time}<0> + B1 \cdot \text{time}<1> + \ldots + B_i \cdot \text{time}<i> + \ldots + B_{N-1} \cdot \text{time}<N-1>$$

$$C_S = C0 \cdot \text{time}<0> + C1 \cdot \text{time}<1> + \ldots + C_i \cdot \text{time}<i> + \ldots + C_{N-1} \cdot \text{time}<N-1>$$

For MSB first implementation:

$$A_S = A_{N-1} \cdot \text{time}<0> + A_{N-2} \cdot \text{time}<1> + \ldots + A_{N-1-i} \cdot \text{time}<i> + \ldots + A0 \cdot \text{time}<N-1>$$

$$B_S = B_{N-1} \cdot \text{time}<0> + B_{N-2} \cdot \text{time}<1> + \ldots + B_{N-1-i} \cdot \text{time}<i> + \ldots + B0 \cdot \text{time}<N-1>$$

$$C_S = C_{N-1} \cdot \text{time}<0> + C_{N-2} \cdot \text{time}<1> + \ldots + C_{N-1-i} \cdot \text{time}<i> + \ldots + C0 \cdot \text{time}<N-1>$$

Conversion unit 406 also receives signals P0, P1, P2 and analog reference voltages (signals) VRP, VCM, VRN, and generates output voltage Vout in response to bits $A_S$, $B_S$, and $C_S$.

Sample and hold unit 407 responds to digital signals S and H to sample output voltage Vout and transfers it to an output node of DAC 400 as VDAC. For example, sample and hold unit 407 samples output voltage Vout when S=1 and updates VDAC and hold it to the output of DAC 400 when H=1.

Figure 5:
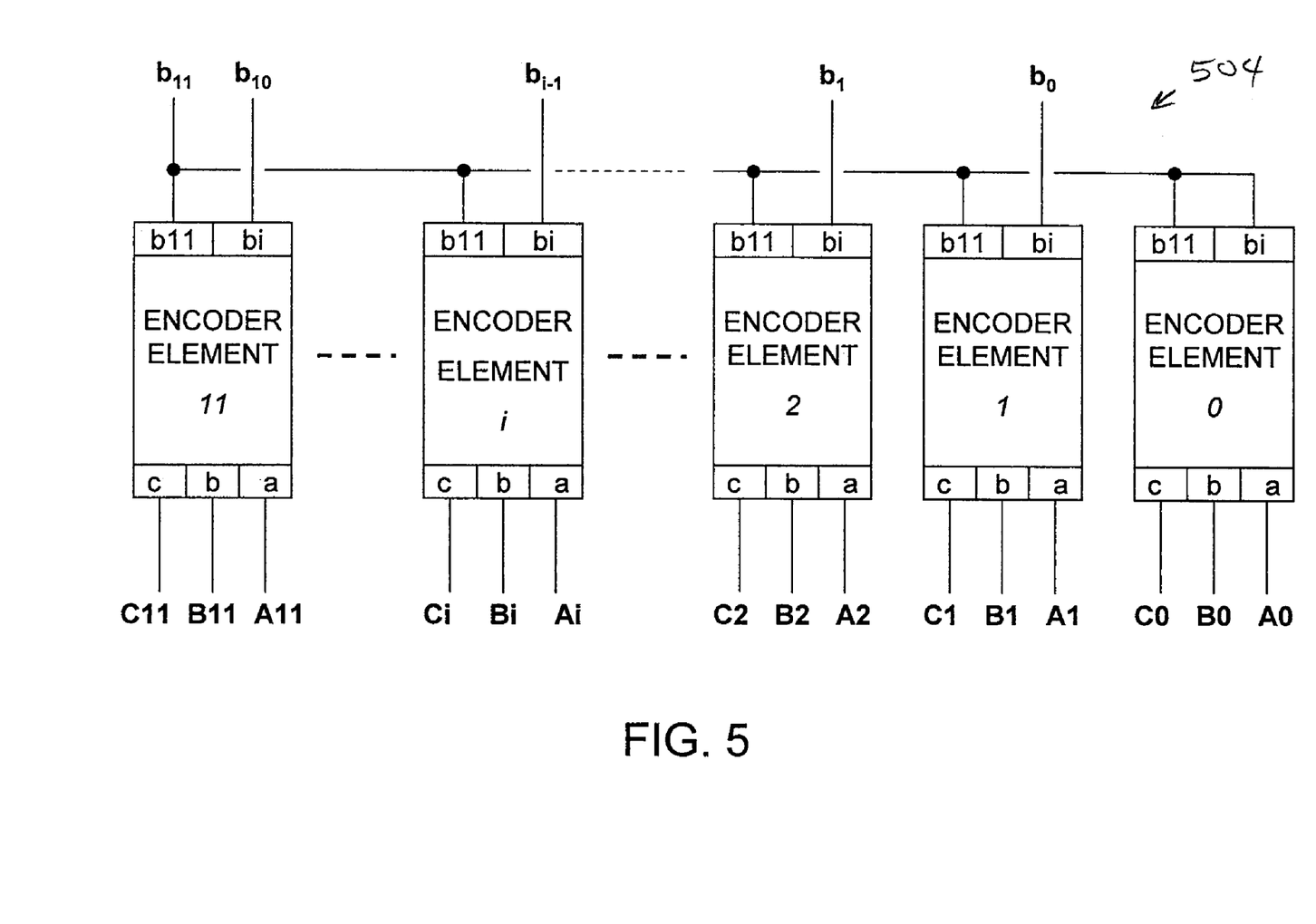
FIG. 5 shows a block diagram of an encoder used in a DAC, according to an embodiment of the invention.

FIG. 5 shows a block diagram of an encoder 504, according to an embodiment of the invention. Encoder 504 can be substituted for input data encoder 404 of FIG. 4. As shown in FIG. 5, encoder 504 includes N identical encoder elements numbered from 0 to N−1. Encoder 504 receives digital input code $b_{N-1}, \ldots, b_2, b_1, b_0$ (or b<N−1:0>) and output three parallel N-bit digital bits (or control bits) A<N−1:0>, B<N−1:0>, and C<N−1:0>. FIG. 5 shows an example where for N=12 bits and the encoding is independent from the technique (LSB or MSB applied first) used to generate the output voltage. As shown in FIG. 5, the most significant bit of the N=12 bit digital input code is $b_{N-1}$ or $b_{11}$ and is a common input to all encoder elements. Other inputs from $b_{N-2}$ down to $b_0$ are connected as shown. For each encoder element, there is a 1 bit shift (left) between input b<N−1:0> and output A<N−1:0>, and B<N−1:0>, and C<N−1:0>. Therefore, (A0, B0, C0) are produced from $b_{N-1}$ only, for i=0. ($A_i$, $B_i$, $C_i$) are produced from ($b_{i-1}$ and $b_{N-1}$) for i=1 to N−1.

Encoder 504 digitally implements the function described in equation (2) and (3) above. Thus, for i=0 to N−1, ($A_i$, $B_i$, $C_i$) can be calculated as follows.

$A_i = 1$ when $f_i = +1$ otherwise $A_i = 0$ $B_i = 1$ when $f_i = 0$ otherwise $B_i = 0$ $C_i = 1$ when $f_i = -1$ otherwise $C_i = 0$ Table 3 is a truth table for encoder 504 when N=4 bits.

TABLE 3

| | input | | | | representation | | | | output | | | | | | | | | | | |
|---|---|---|---|---|---|---|---|---|---|---|---|---|---|---|---|---|---|---|---|---|
| code | b3 | b2 | b1 | b0 | f3 | f2 | f1 | f0 | A3 | A2 | A1 | A0 | B3 | B2 | B1 | B0 | C3 | C2 | C1 | C0 |
| 0 | 0 | 0 | 0 | 0 | −1 | −1 | −1 | −1 | 0 | 0 | 0 | 0 | 0 | 0 | 0 | 0 | 1 | 1 | 1 | 1 |
| 1 | 0 | 0 | 0 | 1 | −1 | −1 | 0 | −1 | 0 | 0 | 0 | 0 | 0 | 0 | 1 | 0 | 1 | 1 | 0 | 1 |
| 2 | 0 | 0 | 1 | 0 | −1 | 0 | −1 | −1 | 0 | 0 | 0 | 0 | 0 | 1 | 0 | 0 | 1 | 0 | 1 | 1 |
| 3 | 0 | 0 | 1 | 1 | −1 | 0 | 0 | −1 | 0 | 0 | 0 | 0 | 0 | 1 | 1 | 0 | 1 | 0 | 0 | 1 |
| 4 | 0 | 1 | 0 | 0 | 0 | −1 | −1 | −1 | 0 | 0 | 0 | 0 | 1 | 0 | 0 | 0 | 0 | 1 | 1 | 1 |
| 5 | 0 | 1 | 0 | 1 | 0 | −1 | 0 | −1 | 0 | 0 | 0 | 0 | 1 | 0 | 1 | 0 | 0 | 1 | 0 | 1 |
| 6 | 0 | 1 | 1 | 0 | 0 | 0 | −1 | −1 | 0 | 0 | 0 | 0 | 1 | 1 | 0 | 0 | 0 | 0 | 1 | 1 |
| 7 | 0 | 1 | 1 | 1 | 0 | 0 | 0 | −1 | 0 | 0 | 0 | 0 | 1 | 1 | 1 | 0 | 0 | 0 | 0 | 1 |
| 8 | 1 | 0 | 0 | 0 | 0 | 0 | 0 | +1 | 0 | 0 | 0 | 1 | 1 | 1 | 1 | 0 | 0 | 0 | 0 | 0 |
| 9 | 1 | 0 | 0 | 1 | 0 | 0 | +1 | +1 | 0 | 0 | 1 | 1 | 1 | 1 | 0 | 0 | 0 | 0 | 0 | 0 |
| 10 | 1 | 0 | 1 | 0 | 0 | +1 | 0 | +1 | 0 | 1 | 0 | 1 | 1 | 0 | 1 | 0 | 0 | 0 | 0 | 0 |
| 11 | 1 | 0 | 1 | 1 | 0 | +1 | +1 | +1 | 0 | 1 | 1 | 1 | 1 | 0 | 0 | 0 | 0 | 0 | 0 | 0 |
| 12 | 1 | 1 | 0 | 0 | +1 | 0 | 0 | +1 | 1 | 0 | 0 | 1 | 0 | 1 | 1 | 0 | 0 | 0 | 0 | 0 |
| 13 | 1 | 1 | 0 | 1 | +1 | 0 | +1 | +1 | 1 | 0 | 1 | 1 | 0 | 1 | 0 | 0 | 0 | 0 | 0 | 0 |
| 14 | 1 | 1 | 1 | 0 | +1 | +1 | 0 | +1 | 1 | 1 | 0 | 1 | 0 | 0 | 1 | 0 | 0 | 0 | 0 | 0 |
| 15 | 1 | 1 | 1 | 1 | +1 | +1 | +1 | +1 | 1 | 1 | 1 | 1 | 0 | 0 | 0 | 0 | 0 | 0 | 0 | 0 |

Figure 6:
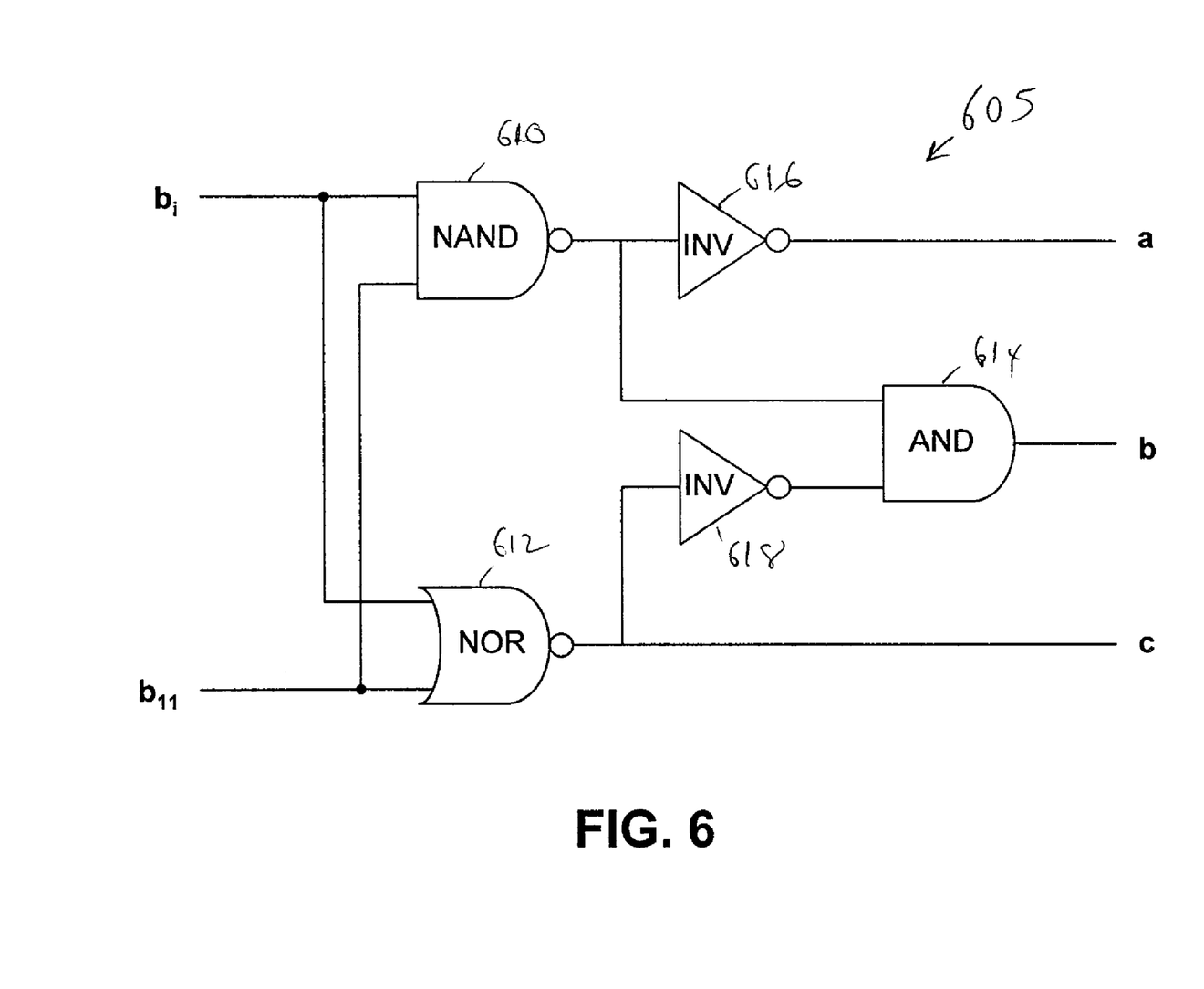
FIG. 6 shows a schematic diagram of an encoder element of an encoder, according to an embodiment of the invention.

FIG. 6 shows a schematic diagram of an encoder element 605, according to an embodiment of the invention. Encoder element 605 includes two digital input $b_i$ and $b_{N-1}$ and three digital output a, b, and c. FIG. 6 shows encoder element 605 including 12 bits (N=12). Thus, $b_{N-1} = b11$. Encoder element 605 includes a combination of five digital gates including a NAND gate 610, a NOR gate 612, an AND gate 614, and inverters 616 and 618. FIG. 6 shows an example of encoder element 605. Other implementation can be used to generate output a, b, and c.

Based on the arrangement of the components of FIG. 6, input to output equations can be simplified as:

| output | note |
|---|---|
| $a = b_{N-1} \cdot b_i$ | (AND) |
| $b = b_{N-1} \oplus b_i$ | $\oplus$ is the XOR (exclusive or) |
| $c = \overline{b_{N-1} + b_i}$ | (NOR) |

The output (a,b,c) of encoder element 605 are mutually exclusive.

The truth table for encoder element 605 is given in Table 4.

TABLE 4

| input | | output | | |
|---|---|---|---|---|
| $b_{N-1}$ | $b_i$ | a | b | c |
| 0 | 0 | 0 | 0 | 1 |
| 0 | 1 | 0 | 1 | 0 |
| 1 | 0 | 0 | 1 | 0 |
| 1 | 1 | 1 | 0 | 0 |

Figure 7:
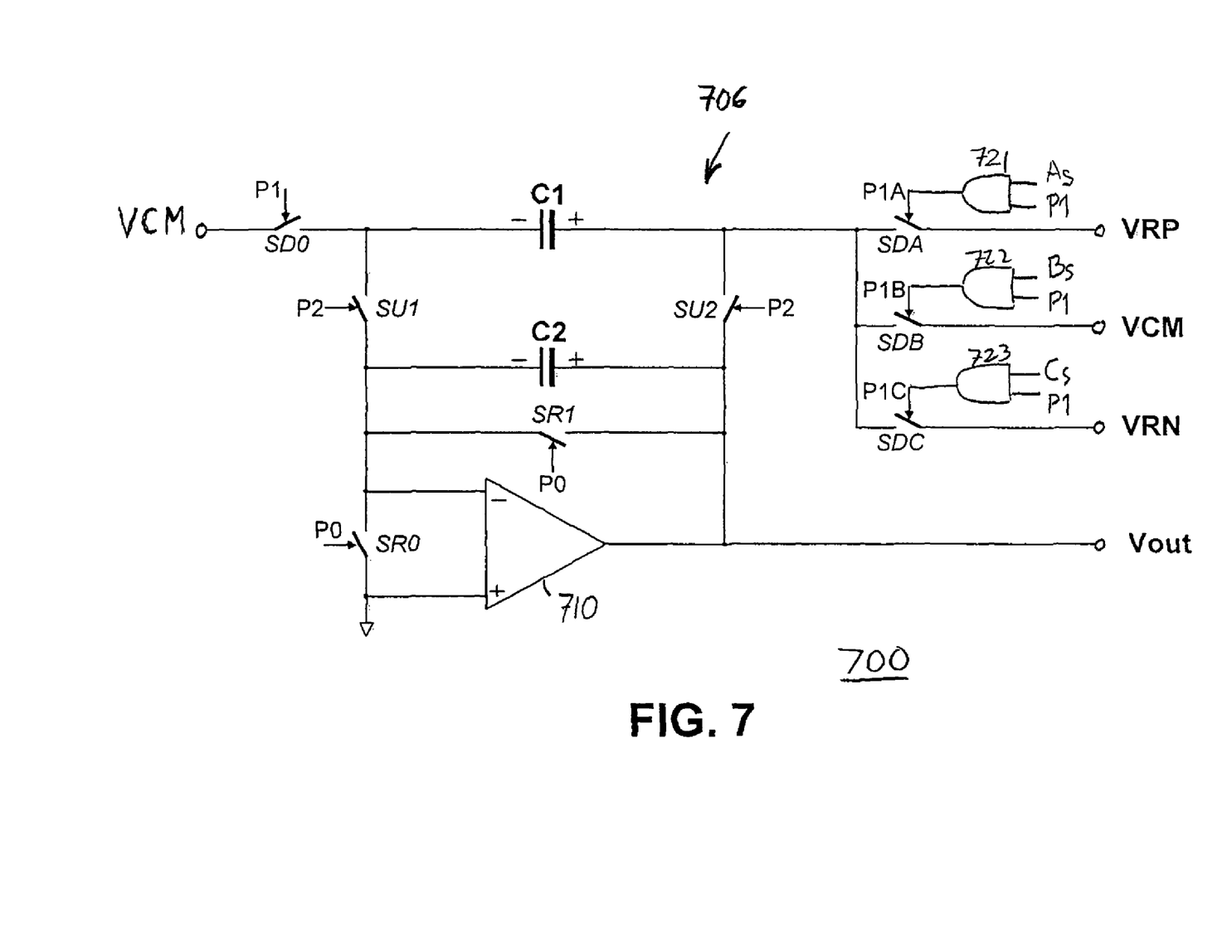
FIG. 7 shows a partial block diagram of a DAC having a conversion unit, according to an embodiment of the invention.

FIG. 7 shows a partial block diagram of a DAC 700 having a conversion unit 706, according to an embodiment of the invention. Conversion unit 706 can be substituted for conversion unit 406 of DAC 400 of FIG. 4. Conversion unit 706 is a single-ended version of a digital to analog conversion unit used to generate a single-ended analog output voltage Vout. A fully differential conversion unit to generate a differential output voltage can also be implemented, such as the one shown in FIG. 9.

As shown in FIG. 7, DAC 700 includes three analog reference voltages VRP, VCM, and VRN, which can be used to provide reference voltages such as +Vref, 0, and −Vref described above with reference to FIG. 1 through FIG. 6. Reference voltage VCM has a value equal to the average of the values of reference voltages VRP and VRN.

DAC 700 also includes three digital inputs $A_S$, $B_S$, and $C_S$ containing information of the serial input code at corresponding allocated time slots. $A_S$, $B_S$, and $C_S$ correspond to A<N−1:0>, B<N−1:0>, and C<N−1:0>, respectively, described above with reference to FIG. 4 and FIG. 5. DAC 700 also includes three signals P0, P1, P2 containing information of a reset phase (P0), a sampling phase (P1), and an analog update phase (P2).

DAC 700 also includes an amplifier 710 and a capacitor network including capacitors C1 and C2. Amplifier 710 is a single-ended operational amplifier. However, a fully differential operational amplifier can be used in the differential version of conversion unit 706. Capacitors C1 and C2 have the same capacitance value C. DAC 700 also includes switching circuitry having switches SD0, SDA, SDB, SDC, SU1, SU2, SR0, and SR1. Switches SDA, SDB, and SDC are controlled by control signals P1A, P1B, and P1C, respectively.

The switches shown in FIG. 7 may be implemented using any suitable circuit element(s). For example, in some cases, one or more switches are implemented using isolated gate transistors such as metal oxide semiconductor field effect transistors (MOSFET). Further, in other cases, complementary MOSFETs are coupled in parallel to form pass gates. For example, an n-channel MOSFET may be coupled in parallel with a p-channel MOSFET as a transistor pass gate to implement one or more switches in FIG. 7.

DAC 700 also includes gates 721, 722, and 723 to generate signals P1A, P1B, and P1C based on signal P1 and signals $A_S$, $B_S$, and $C_S$, such that P1A=$A_S$.P1 (or a logical AND of $A_S$ and P1); P1B=$B_S$.P1 (or a logical AND of $B_S$ and P1); and P1C=$C_S$.P1 (or a logical AND of $C_S$ and P1). Thus, as shown in FIG. 7, gates 721, 722, and 723 can include logical AND gates to generate signals P1A, P1B, and P1C.

DAC 700 uses switches SR0 and SR1 to reset conversion unit 706, for example, to set output voltage Vout initially at zero. DAC 700 uses switches SD0, SDA, SDB, and SDC to apply reference voltages to the capacitor C1. DAC 700 uses switches SU1 and SU2 to update analog output voltage Vout during a conversion. The operation of DAC 700 is described below with reference to both FIG. 7 and FIG. 8.

Figure 8:
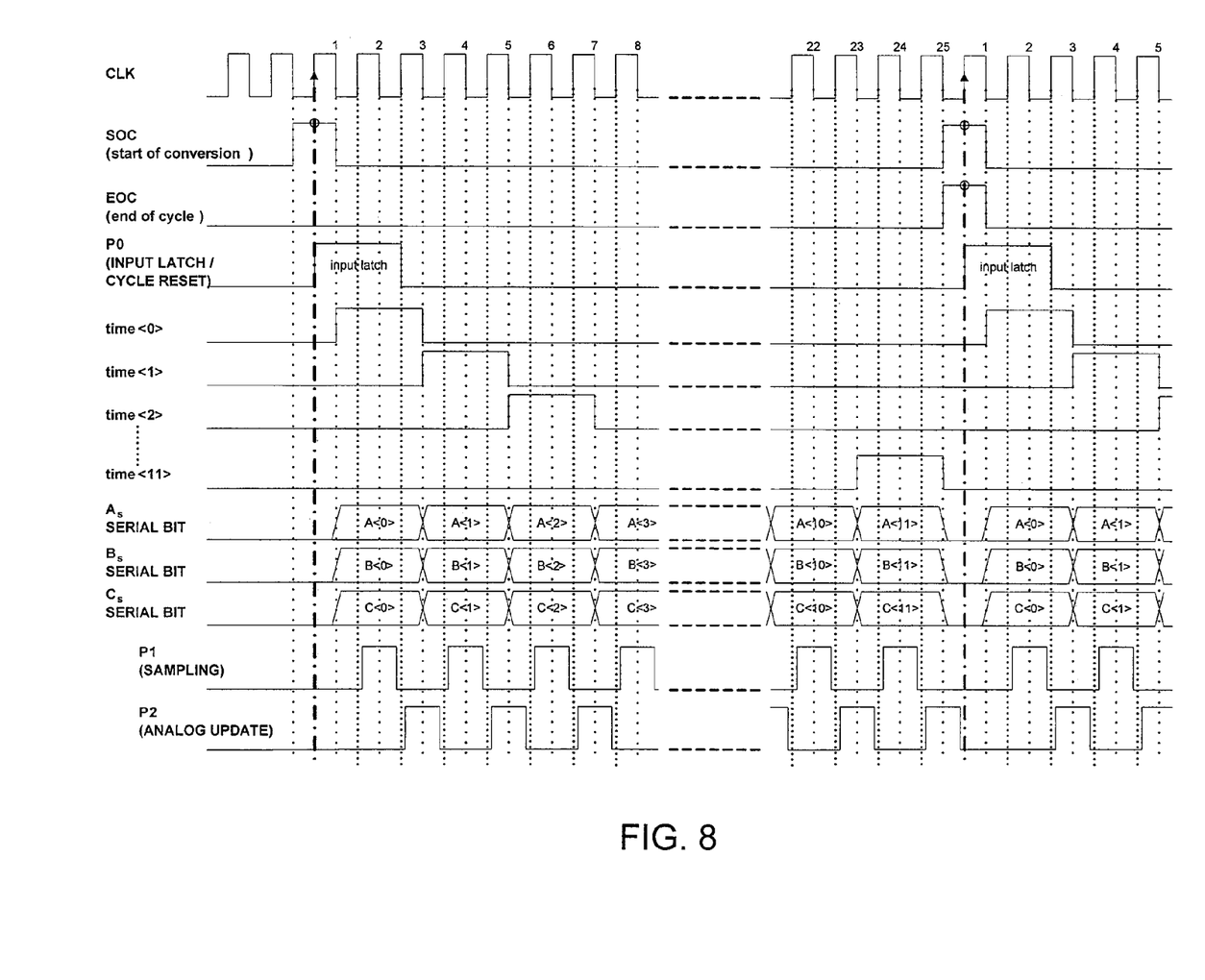
FIG. 8 is an example timing diagram for the DAC of FIG. 4, FIG. 7, and FIG. 9, according to an embodiment of the invention.

FIG. 8 is an example timing diagram for DAC 700 of FIG. 7, according to an embodiment of the invention. Signal CLK is the input clock. The number 1, 2, 3, 4, and 5 through 25 next to the waveform of signal CLK correspond to the periods of the CLK signal.

Signal SOC is the start of conversion signal used to start a conversion. As shown in FIG. 8, the SOC signal may go to a higher level (e.g., high or SOC=1) at period number 1 of the CLK signal to start the conversion. Then, the SOC goes to a lower level (e.g., low of SOC=0) during the conversion. The SOC goes high again at the start of a next conversion.

Signal EOC is the end of cycle signal generated when the conversion is completed. For example, the EOC signal may go to a lower level (e.g., EOC=0) at period number 25, indicating the end of a conversion. As shown in FIG. 8, at period 25 of the CLK signal, the SOC signal can go to a high level at the same time the EOC is high, in order to restart another conversion when the previous one has completed.

Signal P0 is for the beginning of the cycle. When P0 is high (P0=1), the input bus is latched in order to make all the data stable. It is also the time when the conversion unit 706 (FIG. 7) is reset.

Time<0>, time<1>, and time<2> through time<N−1> are periods of time corresponding to the bits being treated during the conversion cycle. In this case, the conversion cycle is based on the LSB first technique, as shown by bits A<0>, B<0>, and C<0> being treated at period number 1 of the CLK signal.

Serial data $A_S$, $B_S$, and $C_S$ are changed on the high level of the time<0> through time<N−1>. A input data encoder (such as input data encoder 404 of FIG. 4) of DAC 700 produces data $A_S$, $B_S$, and $C_S$, such that $A_S$, $B_S$, and $C_S$ are stable when P1 is high for reliable conversion.

Signal P1 is used for sampling the reference voltages (VRP, VCM, VRN) during the conversion. Signal P2 is used for updating the value of analog output voltage Vout. As shown in FIG. 8, for each data bit, signals P1 and P2 are alternately asserted. The time period during which P1 is asserted is referred to herein as "phase one" for a particular data bit. The time period during which P2 is asserted is referred to herein as "phase two" for the same data bit. In some embodiments, phases one and two do not overlap, such that they cannot both be high at the same time. For example, the switches in FIG. 7 that are turned on (closed) during phase one are turned off (opened) before the phase two switches close during phase two. Likewise, the phase two switches are turned off prior to the phase one switches turning on. The width of signals P1 and P2 when they are high (P1=1 or P2=1) can be substantially equal to the period of the CLK signal (Tclk), such that the non overlap delay is negligible relative to Tclk.

The total number of periods of the CLK signal used in a conversion ($T_{DAC}$) is calculated as follows. Resetting conversion unit 706 can be performed in one period Tclk of the CLK signal at the beginning of the conversion, which is the time between the rising edge of the P0 signal and the first rising edge of the P1 signal at period number 1 of the CLK signal. To obtain a final value of output voltage Vout from a conversion of a digital input code of N bits, the number of times the P1 signal is high (P1=1) is equal to N, and the number of times the P2 signal is high (P2=1) is also equal to N. Therefore, the total number of periods of the CLK signal used in a conversion is $T_{DAC}$=2N+1. Thus, if N=12, then $T_{DAC}$=25. If the CLK signal has as frequency of 50 MHz (megahertz) used in conversion unit 706, then DAC 700 will produce a data rate of 2 Msps (Million of samples per second). The operation of DAC 700 based on the timing of FIG. 8 is described below.

At the time when P0=1, switches SR0 and SR1 are turned on (closed) so that the system is reset giving initial output voltage Vout=0. A zero voltage is also stored across capacitor C2, which is shorted by switches SR1 being turned on. Switches SR0 and SR1 are turned off (opened) the rest of the time when P0=0. Thus, output voltage Vout is initially equal to zero. Then, DAC 700 performs N steps numbered j (j=0 to N−1) to successively apply reference voltages VRP, VRN, and VCM to conversion unit 706 to update the value of output voltage Vout as follows.

At all times when P1=1, switch SD0 is turned on. Capacitor C1 is charged as follows.

C1 is charged to $VRP-VCM=+Vref$ through switch $SDA$ if $A_S=1$ $VCM-VCM=0$ through switch $SDB$ if $B_S=1$ $VRN-VCM=-Vref$ through switch $SDC$ if $C_S=1$ When P1=0, switches SD0, SDA, SDB, and SDC are all turned off.

When P1=1 (P2=0), output voltage Vout does not change because it is held by the voltage across capacitor C2 which does not change. This (when P1=1 and P2=0) can be considered a memory state for output voltage Vout.

Thus, at step j (when P1=1) the value of output voltage $Vout_j$ is (at step $j$, P1=1), $Vout_j = Vout_{j-1}$ At all times when P2=1, switches SU1 and SU2 are turned on. Thus, capacitor C1 is connected in parallel with capacitor C2 between the inverted (−) input node and the output node of amplifier 710. The charges previously stored in capacitor C1 (e.g., when P1=1 and P2=0) are then equally spread over the parallel combination of capacitors C1 and C2. Since the capacitance value of capacitors C1 and C2 is the same, the parallel combination of capacitors C1 and C2 is twice the capacitance of capacitor C1 (C1+C2=2C1). Therefore, the charges previously stored in capacitor C1 are divided by two. Switches SU1 and SU2 are turned off the rest of the time when P2=0. Thus, at step j (P2=1) the value of output voltage $Vout_j$ is (at step $j$, $P2=1$),
$$Vout_j = \frac{Vout_{j-1} + As_j \cdot Vref + Bs_j \cdot 0 - Cs_j \cdot Vref}{2}$$

By incrementing j and repeating previous operations P1−P2−P1−P2 (P1=1, P2=1, P1=1, and so on) up to j=N−1 leads to the final value of output voltage $Vout_{N-1}$:

(at step $N-1$, $P2 = 1$),
$$Vout_{N-1} = \sum_{j=0}^{N-1} \frac{As_j \cdot Vref + Bs_j \cdot 0 - Cs_j \cdot Vref}{2^{N-j}}$$

Thus the final output voltage is reached at the end of the last P2=1 time slot.

As described above, the update of the output voltage Vout is performed by letting the capacitor C1 and C2 share their respective charges without loading input nodes (+ and −) of amplifier 710 for the charge sharing. Thus, DAC 700 can be relatively insensitive to the amplifier bandwidth of amplifier 710. The capacitance values of capacitors C1 and C2 can be relatively large without affecting the speed of the DAC 700. Errors due to mismatch in coefficient values of capacitors C1 and C2 can also be minimized.

Figure 9:
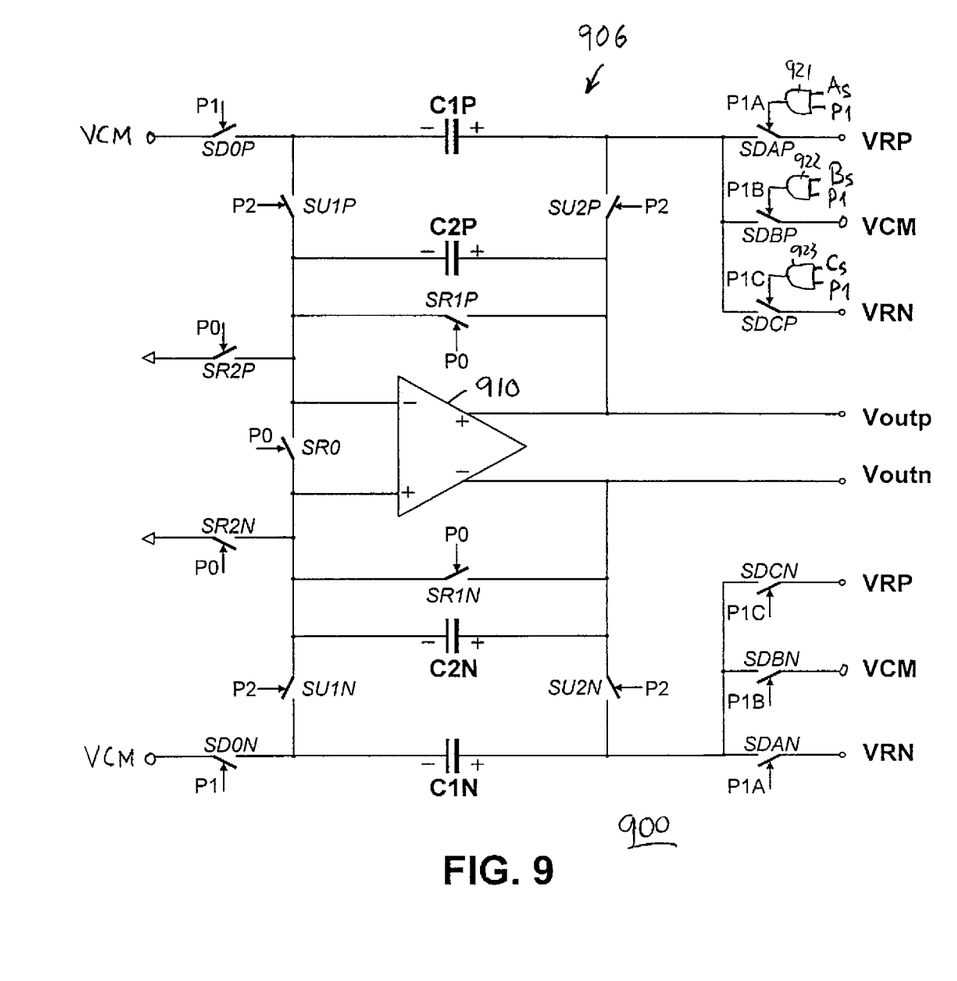
FIG. 9 shows a partial block diagram of a differential DAC having a differential conversion unit, according to an embodiment of the invention.

FIG. 9 shows a partial block diagram of a differential DAC 900 having a differential conversion unit 906, according to an embodiment of the invention. Since DAC 900 is differential, the analog output voltage (e.g., Voutdiff) of DAC 900 can be defined as a function of output voltages Voutp and Voutn, e.g., Voutdiff=Voutp−Voutn. DAC 900 includes reference voltages VRP, VCM, and VRN, an operational amplifier 910, a capacitor network including capacitors C1P, C2P, C1N, and C2N, and a switching circuitry including switches SD0P, SDAP, SDBP, SDCP, SU1P, SU2P, SR1P, SR2P, SD0N, SDAN, SDBN, SDCN, SU1N, SU2N, SR1N, SR2N, and SR0. These switches are controlled by signals P1A, P1B, and P1C, as shown in FIG. 9. DAC 900 also includes gates 921, 922, and 923 to generate signals P1A, P1B, and P1C based on signal P1 and signals $A_S$, $B_S$, and $C_S$.

The operation of DAC 900 is similar to the operation of DAC 700 of FIG. 7. For example, during reset when P0=1, switches SR1P, SR2P, SR1N, SR2N and SR0 are turned on (closed) so that the system is reset, giving initial output voltage Voutp=Voutn=0. Thus, Voutdiff=Voutp−Voutn=0 at reset. A zero voltage is also stored across capacitors C2P and C2N which are shorted by switches SR1P and SR1N being turned on. Switches SR1P, SR2P, SR1N, SR2N are turned off (opened) the rest of the time when P0=0. Thus, output voltages Voutp, Voutn, and Voutdiff are initially equal to zero. Then, DAC 900 performs N steps numbered j (j=0 to N−1) to successively apply reference voltages VRP, VRN, and VCM to conversion unit 906 to update the values of output voltages Voutp, Voutn and Voutdiff as follows.

At all times when P1=1, switches SD0P and SD0N are turned on. Capacitors C1P and C1N are charged as follows.

C1P is charged to $VRP-VCM=+Vref$ through switch $SDAP$ if $A_S=1$ $VCM-VCM=0$ through switch $SDBP$ if $B_S=1$ $VRN-VCM=-Vref$ through switch $SDCP$ if $C_S=1$ C1N is charged to $VRN-VCM=-Vref$ through switch $SDAN$ if $A_S=1$ $VCM-VCM=0$ through switch $SDBN$ if $B_S=1$ $VRP-VCM=+Vref$ through switch $SDCN$ if $C_S=1$ When P1=0, switches SD0P, SDAP, SDBP, SDCP and SD0N, SDAN, SDBN, SDCN are all turned off.

When P1=1 (P2=0), output voltages Voutp and Voutn do not change because they are held by the voltage across capacitors C2P and C2N, respectively, which do not change. This (when P1=1 and P2=0) can be considered a memory state for output voltages Voutp, Voutn, and Voutdiff.

Thus, at step j (when P1=1) the value of output voltages are:

(at step $j$, P1=1), $Voutp_j = Voutp_{j-1}$ (at step $j$, P1=1), $Voutn_j = Voutn_{j-1}$ (at step $j$, P1=1), $Voutdiff_j = Voutdiff_{j-1}$ At all times when P2=1, switches SU1P, SU2P, SU1N, and SU2N are turned on. Thus, capacitor C1P is connected in parallel with capacitor C2P between the inverted (−) input node and the output node (+) of amplifier 910. Capacitor C1N is connected in parallel with capacitor C2N between the non-inverted (+) input node and the output node (−) of amplifier 910. The charges previously stored in capacitor C1P (e.g., when P1=1 and P2=0) are then equally spread over the parallel combination of capacitors C1P and C2P. The charges previously stored in capacitor C1N (e.g., when P1=1 and P2=0) are then equally spread over the parallel combination of capacitors C1N and C2N. Since the capacitance value of capacitors C1P and C2P is the same, the parallel combination of capacitors C1P and C2P is twice the capacitance of capacitor C1P (C1P+C2P=2C1P). Therefore, the charges previously stored in capacitor C1P are divided by two. Since the capacitance value of capacitors C1N and C2N is the same, the parallel combination of capacitors C1N and C2N is twice the capacitance of capacitor C1N (C1N+C2N=2C1N). Therefore, the charges previously stored in capacitor C1N are also divided by two. Switches SU1P, SU2P, SU1N, and SU2N are turned off the rest of the time when P2=0. Thus, at step j (P2=1) the value of output voltages $Voutp_j$, $Voutn_j$ and $Voutdiff_j$ are shown below.

(at step $j$, $P2 = 1$), $$Voutp_j = \frac{Voutp_{j-1} + As_j \cdot Vref + Bs_j \cdot 0 - Cs_j \cdot Vref}{2}$$

(at step $j$, $P2 = 1$), $$Voutn_j = \frac{Voutn_{j-1} - As_j \cdot Vref + Bs_j \cdot 0 + Cs_j \cdot Vref}{2}$$

(at step $j$, $P2 = 1$), $$Voutdiff_j = Voutp_j - Voutn_j$$

Incrementing j and repeating previous operations P1–P2–P1–P2 up to j=N−1 leads to the final value of output voltages $Voutp_{N-1}$, $Voutn_{N-1}$ and $Voutdiff_{N-1}$ as follows.

(at step $N$-1, $P2 = 1$), $$Voutp_{N-1} = \sum_{j=0}^{N-1} \frac{As_j \cdot Vref + Bs_j \cdot 0 - Cs_j \cdot Vref}{2^{N-j}}$$

(at step $N$-1, $P2 = 1$), $$Voutn_{N-1} = \sum_{j=0}^{N-1} \frac{-As_j \cdot Vref + Bs_j + Cs_j \cdot Vref}{2^{N-j}}$$

(at step $N$-1, $P2 = 1$), $$Voutdiff_{N-1} = Voutp_{N-1} - Voutn_{N-1} = 2Voutp_{N-1}$$

Thus the final output voltages are reached at the end of the last P2=1 time slot. The amplitude of analog output voltage Voutdiff of DAC 900 of FIG. 9 is twice the amplitude of analog output voltage Vout of DAC 700 of FIG. 7 because Voutdiff associated with FIG. 9 is differential whereas Vout associated with FIG. 7 is single-ended. Therefore, in applications where the output dynamic range of the DAC is a concern, DAC 900 can be more applicable than DAC 700.

One or more embodiments described herein include apparatus and methods having an amplifier, a capacitor network coupled to the amplifier, and switching circuitry coupled to the amplifier and the capacitor network. The switching circuit is configured to successively apply a selected reference voltage selected from among a first reference voltage, a second reference voltage, and a third reference voltage to the capacitor network in response to a digital input code to generate an output voltage. Other embodiments, including additional apparatus and methods, are described above with reference to FIG. 1 through FIG. 9.

The illustrations of the apparatus, such as apparatus 101, DAC 400, DAC 700, and DAC 900, are intended to provide a general understanding of the structure of various embodiments and not a complete description of all the elements and features of the apparatus that might make use of the structures described herein.

Any of the components described above can be implemented in a number of ways, including simulation via software. Thus, the apparatus (e.g., apparatus 101, DAC 400, DAC 700, and DAC 900) and their associated components described above can all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatus 101, DAC 400, DAC 700, and DAC 900), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer and multi-chip modules. Such apparatus may further be included as sub-components within a variety of electronic systems such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. A cyclic digital to analog converter comprising:
   an amplifier including a first input node, a second input node, and an output node;
   a capacitor network including a first capacitor and a second capacitor coupled to the amplifier;

three fixed reference voltages coupled to a voltage input node coupled to the capacitor network; and a control circuit comprising an input, the control circuit being configured to receive via the input a digital input code comprising a plurality of bits, the digital input code specifying an output voltage; and switching circuitry coupled to the control circuit, the control circuit configured to control the switching circuitry to generate the output voltage on the output node of the amplifier after a plurality of cycles, each cycle corresponding to one of the plurality of bits of the digital input code, the control circuit configured to control the switching circuitry to, for each cycle of the plurality of cycles, apply, via the voltage input node, a selected reference voltage selected from among the three fixed reference voltages, and wherein the control circuit is configured to control the switching circuitry to, for each cycle of the plurality of cycles, couple the first capacitor in parallel with the second capacitor between an input node of the amplifier and the output node of the amplifier.

2. The digital to analog converter of claim 1, wherein the switching circuitry includes at least one switch configured to apply the selected reference voltage to the capacitor network in response to a control signal generated based, at least in part, on a logical combination of two bits of the digital input code, wherein during one cycle of the plurality of cycles, one of the two bits is selected from a first bit position of the digital input code and the other of the two bits is selected from a second bit position of the digital input code, and wherein during a successive cycle of the plurality of cycles, one of the two bits is selected from the first bit position of the digital input code and the other of the two bits is selected from a third bit position of the digital input code.

3. The cyclic digital to analog converter of claim 1, wherein a first plate of the first capacitor is configured to share charge with a first plate of the second capacitor and a second plate of the first capacitor is configured to share charge with a second plate of the second capacitor when at least one switch of the switching circuitry is turned on.

4. The cyclic digital to analog converter of claim 3, wherein the first and second capacitors have a same capacitance value.

5. The cyclic digital to analog converter of claim 1, wherein the switching circuitry is configured to apply the selected reference voltage to both a first plate and a second plate of the first capacitor of the capacitor network when at least one switch of the switching circuitry is turned on.

6. The cyclic digital to analog converter of claim 1, wherein one of the three fixed reference voltages is zero volts.

7. The cyclic digital to analog converter of claim 1, wherein the switching circuitry is further configured to sequentially apply one of the first fixed reference voltage, the second fixed reference voltage, or the third fixed reference voltage as the selected reference voltage for each bit of the digital input code based on serial input of a control signal derived from the digital input code.

8. The cyclic digital to analog converter of claim 1, wherein the control signal includes three bits, wherein a first of the three bits is applied to a switch controlling application of the first fixed reference voltage to the capacitor network, a second of the three bits is applied to a switch controlling application of the second fixed reference voltage to the capacitor network, and a third of the three bits is applied to a switch controlling application of the third fixed reference voltage to the capacitor network.

9. The cyclic digital to analog converter of claim 1, the control circuit comprising three outputs coupled to the switching circuitry, the control circuit comprising one or more inputs configured to receive the digital input code, the control circuit configured to perform operations comprising:

in a first cycle of the plurality of cycles, selecting a first bit from the digital input code and a second bit from the digital input code and logically combining the first bit and second bit to generate a control signal; and in a second cycle of the plurality of cycles, selecting the first bit and a third bit from the digital input code and logically combining the first bit and third bit to generate a control signal.

10. A cyclic digital to analog converter comprising:

an amplifier including a first input node, a second input node, and an output node;

a capacitor network including a first capacitor coupled between a first node and a second node, a second capacitor coupled between the first input node and the output node of the amplifier, a third capacitor coupled between a third node and a fourth node, and a fourth capacitor coupled between the second input node of the amplifier and an additional output node of the amplifier;

a first voltage input node coupled to at least one, but not all, of the first, second, third, and fourth capacitors;

a second voltage input node coupled to a different one of the first, second, third, and fourth capacitors;

a first set of three fixed reference voltages nodes coupled to the first voltage input node;

a second set of three fixed references voltage nodes coupled to the second voltage input node;

a control circuit comprising a digital input, the control circuit being configured to receive via the digital input a digital input code comprising a plurality of bits, the digital input code specifying an output voltage; and switching circuitry coupled to the first and second capacitors and including a number of switches, the switching circuitry also coupled to the control circuit, the control circuit configured to cause the switching circuitry to generate the output voltage on an output node of the amplifier after a plurality of cycles, each cycle corresponding to one of the plurality of bits of the digital input code, and the control circuit also configured to, for each of the plurality of cycles, cause the switching circuitry to selectively apply one voltage from the first set of three fixed reference voltages to the first capacitor to couple the first capacitor in parallel with the second capacitor between the first input node of the amplifier and the output node of the amplifier, and to couple the third capacitor in parallel with the fourth capacitor between the second input node of the amplifier and the additional output node of the amplifier.

11. The cyclic digital to analog converter of claim 10, wherein the number of switches includes:

a first switch responsive to a first control signal to apply a first reference voltage from among the first set of three fixed references voltages to the first capacitor;

a second switch responsive to a second control signal to apply a second reference voltage from among the first set of three fixed reference voltages to the first capacitor; and a third switch responsive to a third control signal to apply a third reference voltage from among the first set of three fixed reference voltages to the first capacitor.

12. The cyclic digital to analog converter of claim 11, further comprising an encoder element comprising:

a first input to receive a first bit of a digital input code;

a second input to receive a second bit of the digital input code; and one output node to provide a control bit used to generate at least one of the first, second, and third control signals.

13. The cyclic digital to analog converter of claim 12, wherein the encoder comprises:
   a NAND gate comprising a first input configured to receive a first bit and a second input configured to receive a second bit of the digital input code;
   a NOR gate configured to receive the first bit and the second bit of the digital input code and to provide a first control signal on an output of the NOR gate;
   a first inverter coupled to an output of the NAND gate and configured to provide a second control signal on an output of the first inverter;
   a second inverter coupled to the output of the NOR gate; and
   an AND gate coupled to an output of the second inverter and also coupled to the output of the NAND gate, the AND gate configured to provide a third control signal on an output of the AND gate.

14. The cyclic digital to analog converter of claim 10, wherein the switching circuitry includes:
   a first switch coupled between the first node and the first input node of the amplifier; and
   a second switch coupled between the second node and the output node of the amplifier.

15. The cyclic digital to analog converter of claim 10, the control circuit comprising three outputs coupled to the switching circuitry, the control circuit comprising one or more inputs configured to receive the digital input code, the control circuit configured to perform operations comprising:
   in a first cycle of the plurality of cycles, selecting a first bit from the digital input code and a second bit from the digital input code and logically combining the first bit and second bit to generate a control signal; and
   in a second cycle of the plurality of cycles, selecting the first bit and a third bit from the digital input code and logically combining the first bit and third bit to generate a control signal.

16. A method comprising:
   generating an output voltage at an output node of an amplifier of a cyclic digital to analog converter;
   applying a selected reference voltage selected from among a first fixed reference voltage, a second fixed reference voltage, and a third fixed reference voltage to a first capacitor in a capacitor network of the cyclic digital to analog converter in response to each bit of a plurality of bits of a digital input code, the digital input code specifying the output voltage, the digital input code received at the cyclic digital to analog converter, the first fixed reference voltage and the second fixed reference voltage and the third fixed reference voltage coupled to a voltage input node coupled to the capacitor network;
   updating a value of the output voltage following the applying of the selected reference voltage for each bit of the digital input code, wherein updating includes coupling the first capacitor in parallel with a second capacitor in the capacitor network between an input node of the amplifier and the output node of the amplifier; and
   repeating the applying and the updating for remaining bits of the digital input code.

17. The method of claim 16, wherein applying the selected reference voltage is in response to applying a least significant bit of the digital input code first.

18. The method of claim 16, wherein applying the selected reference voltage is in response to applying a most significant bit of the digital input code first.

19. The method of claim 16, wherein the value of the output voltage is equal to an initial value before applying the selected reference voltage, and wherein updating includes decreasing the initial value if a most significant bit of the digital input code has a first value and increasing the initial value if the most significant bit of the digital input code has a second value.

20. The method of claim 16, wherein updating includes sharing charge between the first and second capacitors of the capacitor network to change the value of the output voltage.

21. The method of claim 16, wherein updating the value of the output voltage includes dividing the value of the output voltage by two without changing the value of the output voltage before the value of the output voltage is divided by two.

22. The method of claim 16, wherein a value of each of the first and second reference voltages is at least equal to zero, and a value of the third reference voltage is an average of the value of the first reference voltage and the value of the second reference voltage.

23. The method of claim 16, wherein a value of one of the first, second, and third reference voltages is zero.

* * * * *

UNITED STATES PATENT AND TRADEMARK OFFICE
CERTIFICATE OF CORRECTION

PATENT NO. : 8,223,056 B2
APPLICATION NO. : 12/436620
DATED : July 17, 2012
INVENTOR(S) : Renaud Dura et al.

It is certified that error appears in the above-identified patent and that said Letters Patent is hereby corrected as shown below:

Column 13, Lines 44-46, delete

" $$Voutn_{N-1} = \sum_{j=0}^{N-1} \frac{-As_j \cdot Vref + Bs_j + Cs_j \cdot Vref}{2^{N-j}}$$ "

and insert

-- $$Voutn_{N-1} = \sum_{j=0}^{N-1} \frac{-As_j.Vref + Bs_j.0 + Cs_j.Vref}{2^{N-j}}$$ --

Column 15, Line 21, Claim 2, delete "The digital" and insert -- The cyclic digital --

Column 16, Line 44, Claim 10, delete "capacitor to" and insert -- capacitor, to --

Signed and Sealed this
Fourth Day of September, 2012

David J. Kappos
*Director of the United States Patent and Trademark Office*